(12) United States Patent
Chou et al.

(10) Patent No.: US 11,908,884 B2
(45) Date of Patent: Feb. 20, 2024

(54) INDUCTIVE DEVICE

(71) Applicant: Taiwan Semiconductor Manufacturing Company, Ltd., Hsinchu (TW)

(72) Inventors: Wei-Yu Chou, Taichung (TW); Yang-Che Chen, Hsin-Chu (TW); Chen-Hua Lin, Douliu (TW); Victor Chiang Liang, Hsinchu (TW); Huang-Wen Tseng, Zhubei (TW); Chwen-Ming Liu, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 17/658,266

(22) Filed: Apr. 7, 2022

(65) Prior Publication Data

US 2022/0231116 A1 Jul. 21, 2022

Related U.S. Application Data

(63) Continuation of application No. 16/947,359, filed on Jul. 29, 2020, now Pat. No. 11,322,576.

(51) Int. Cl.
*H01F 41/34* (2006.01)
*H01L 23/522* (2006.01)
*H01L 27/08* (2006.01)
*H01L 49/02* (2006.01)

(52) U.S. Cl.
CPC ............. *H01L 28/10* (2013.01); *H01F 41/34* (2013.01); *H01L 23/5227* (2013.01); *H01L 27/08* (2013.01)

(58) Field of Classification Search
CPC ... H01L 28/10; H01L 23/645; H01L 23/5227; H01F 27/2804; H01F 17/0006; H01F 3/14; H01F 41/34; H01F 2017/065
USPC .................................. 257/431; 438/125, 322
See application file for complete search history.

(56) References Cited

U.S. PATENT DOCUMENTS

| 10,756,162 | B2 | 8/2020 | Chen et al. |
| 2014/0253272 | A1 | 9/2014 | Sun |
| 2020/0194378 | A1* | 6/2020 | Tang et al. ............ H01L 23/552 |
| 2022/0037458 | A1 | 2/2022 | Chou et al. |

FOREIGN PATENT DOCUMENTS

TW 202011470 A 3/2020

\* cited by examiner

*Primary Examiner* — Thinh T Nguyen
(74) *Attorney, Agent, or Firm* — Harrity & Harrity, LLP

(57) ABSTRACT

An inductive device includes an insulating layer, a lower magnetic layer, and an upper magnetic layer that are formed such that the insulating layer does not separate the lower magnetic layer and the upper magnetic layer at the outer edges or wings of the inductive device. The lower magnetic layer and the upper magnetic layer form a continuous magnetic layer around the insulating layer and the conductors of the inductive device. Magnetic leakage paths are provided by forming openings through the upper magnetic layer. The openings may be formed through the upper magnetic layer by semiconductor processes that have relatively higher precision and accuracy compared to semiconductor processes for forming the insulating layer such as spin coating. This reduces magnetic leakage path variation within the inductive device and from inductive device to inductive device.

13 Claims, 17 Drawing Sheets

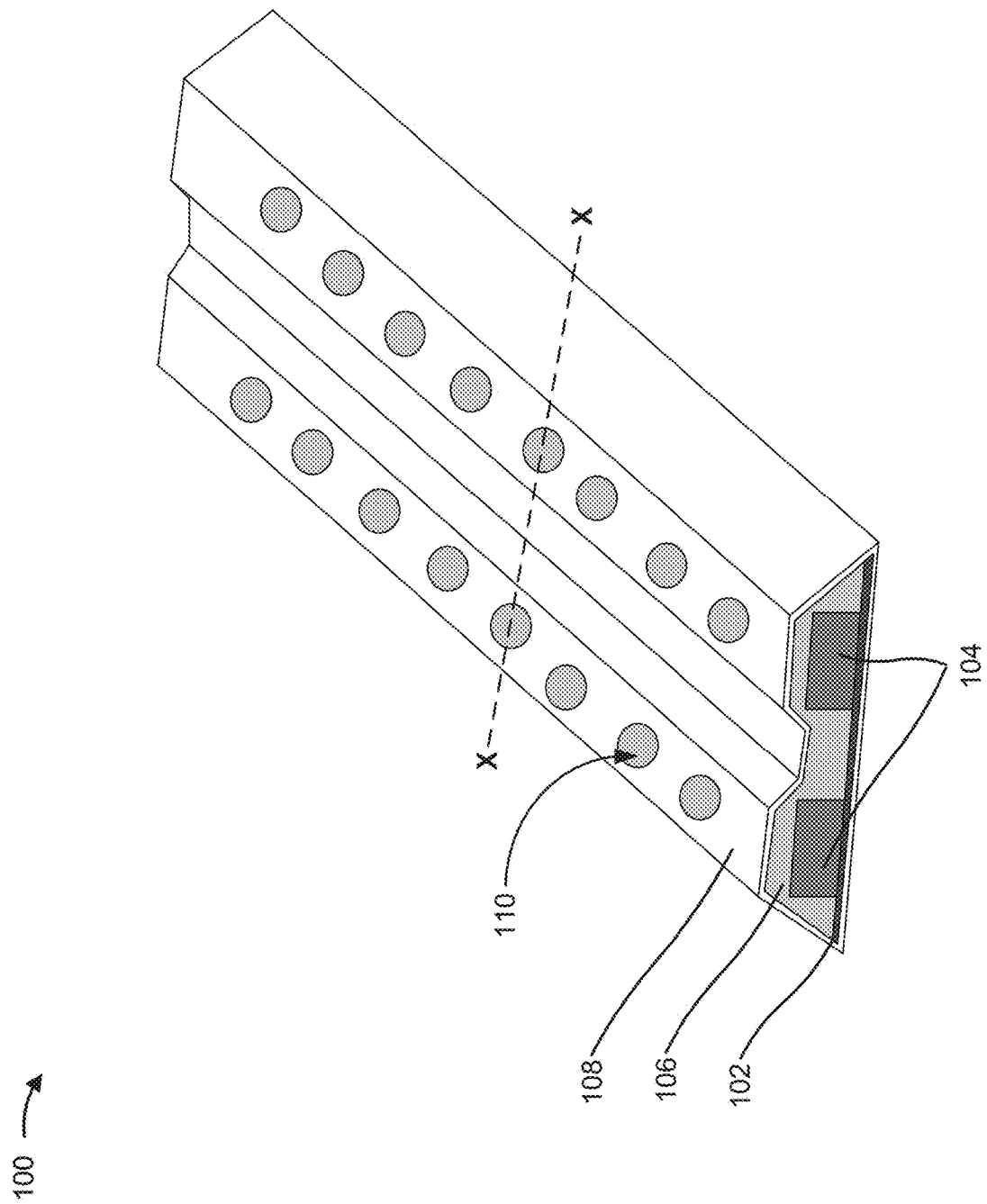

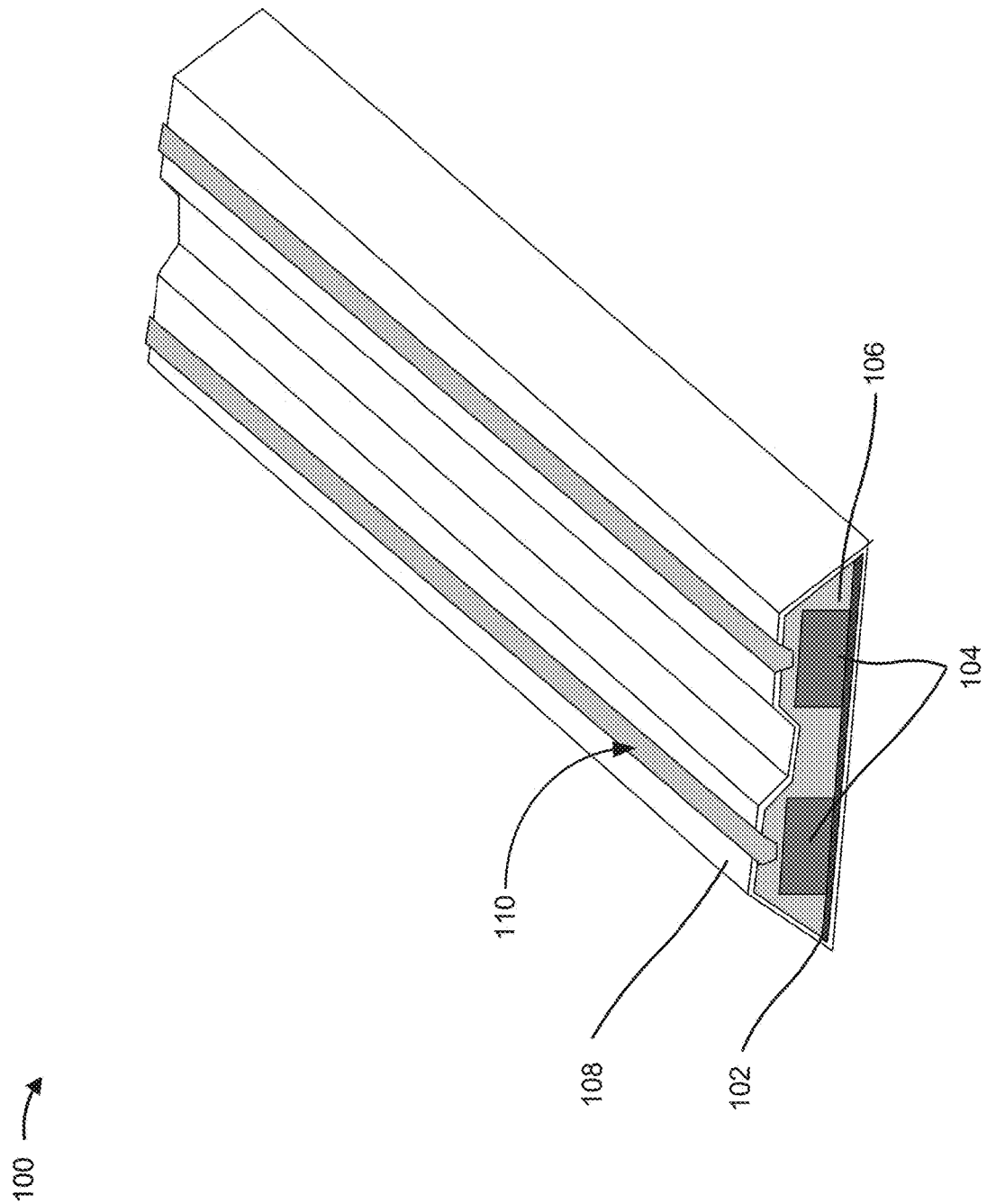

INDUCTIVE DEVICE

RELATED APPLICATION

This application is a continuation of U.S. patent application Ser. No. 16/947,359, filed Jul. 29, 2020, which is incorporated herein by reference in its entirety.

BACKGROUND

An inductor is a passive electronic component that is used in various electronic applications, such as radio frequency filters, alternating current (AC) blockers, voltage regulators, transformers, and/or the like.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1A-1C are diagrams of an example inductive device described herein.

DETAILED DESCRIPTION

Figure 1C:
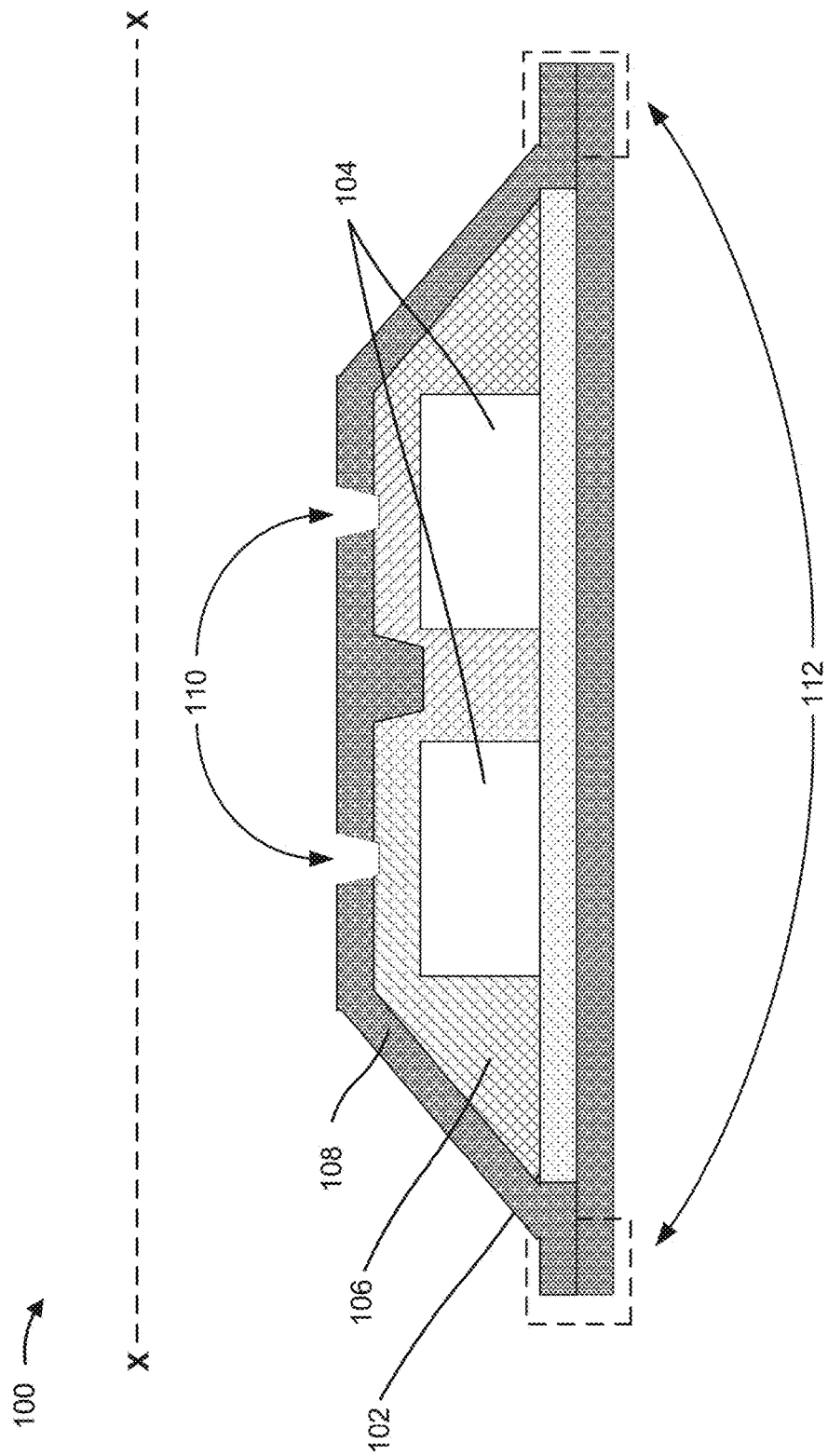

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

An inductor may be designed with various parameters of the inductor in mind, such as inductance, magnetic flux, magnetic leakage paths, saturation current, and/or the like. Due to the imprecise nature of some semiconductor processes such as spin coating, some layers or films of an inductor may result in decreased performance for the inductor. For example, an insulating layer of an inductor may be formed by spin coating. The insulating layer may be used for one or more magnetic leakage paths between a lower magnetic layer and an upper magnetic layer of the inductor. However, spin coating may result in layer thickness variations in the insulating layer from inductor to inductor and/or within the same inductor. These layer thickness variations may produce uneven magnetic leakage paths, which may result in inconsistent electrical performance.

Some implementations described herein provide various inductive devices, such as inductors, coupled inductors, coupled inductor voltage regulators (CLVR), transformers, and/or other types of inductive devices. As further disclosed herein, an inductive device may include an insulating layer, a lower magnetic layer, and an upper magnetic layer that are formed such that the insulating layer does not separate the lower magnetic layer and the upper magnetic layer at the outer edges or wings of the inductive device. The lower magnetic layer and the upper magnetic layer form a continuous magnetic layer around the insulating layer and the conductors of the inductive device. Magnetic leakage paths are provided for the inductive device by forming openings in the upper magnetic layer instead of through the formation of the insulating layer. The openings may be formed in the upper magnetic layer by semiconductor processes that have relatively higher precision and accuracy compared to semiconductor processes for forming the insulating layer such as spin coating. This reduces magnetic leakage path variation within the inductive device and from inductive device to inductive device. Moreover, performance characteristics of the inductive device can be tuned based on the configuration and/or parameters of the openings in the upper magnetic layer to achieve desired and/or optimal inductor performance.

FIGS. 1A-1C are diagrams of one or more examples of an inductive device 100 described herein. Inductive device 100 may be and/or include various types of inductive devices, such as an inductor, a coupled inductor, a CLVR, a transformer, and/or another type of inductive device. FIG. 1A illustrates a perspective view of an example of inductive device 100. FIG. 1B illustrates a perspective view of another example of inductive device 100. FIG. 1C illustrates a cross-sectional view of inductive device along line X-X shown in FIG. 1A. As shown in FIGS. 1A-1C, inductive device 100 may include various components, such as an insulating layer 102, one or more conductors 104, another insulating layer 106, a magnetic layer 108, and one or more openings 110. In some implementations, inductive device 100 includes more components, fewer components, and/or differently configured components than those illustrated in FIGS. 1A-1C.

Insulating layers 102 and 106 may be formed of one or more insulating and/or dielectric materials, such as silicon mononitride (SiN), silicon dioxide (SiO), polyimide, benzocyclobutene, and/or the like. Insulating layers 102 and 106 may insulate conductor(s) 104 from magnetic layer 108. Conductor(s) 104 may include one or more conductive traces, conductive wires, and/or other conductive members of inductive device 100. Conductor(s) 104 may be formed of one or more conductive materials, such as copper, gold, silver, and/or the like. In some implementations, inductive device 100 includes two or more conductors 104, which may correspond to an input of inductive device 100 (e.g., $V_{in}$) and an output from inductive device 100 (e.g., $V_{out}$). Magnetic layer 108 may be formed of one or more magnetic materials, such as a cobalt alloy (e.g., cobalt-zirconium-tantalum (CoZrTa) and/or the like), a nickel alloy (e.g., nickel-iron (NiFe) and/or the like), and/or another magnetic material.

One or more openings 110 may be formed in and/or through magnetic layer to insulating layer 106. Opening(s) 110 provide one or more magnetic leakage paths for inductive device 100. As shown in FIGS. 1A and 1B, opening(s) 110 may have various attributes, such as various sizes, shapes, configurations, spacings, patterns, quantities, and/or the like. In some implementations, the attributes of opening(s) 110 are based on one or more performance parameters to be achieved and/or satisfied for inductive device 100, such as a maximum inductance or initial inductance, a saturation current, and/or the like.

As shown in FIG. 1A, opening(s) 110 may include one or more holes in and/or through magnetic layer 108 to insulating layer 106. In some implementations, inductive device 100 includes a single hole in and/or through magnetic layer 108 to insulating layer 106. In some implementations, inductive device 100 includes a plurality of holes in and/or through magnetic layer 108 to insulating layer 106. The depth of opening(s) 110 may be equal to or greater than the thickness of magnetic layer 108 such that opening(s) 110 are formed completely through magnetic layer 108. In some implementations, opening(s) 110 are formed in and/or through magnetic layer 108 at a top of inductive device 100, are formed in and/or through magnetic layer 108 at a bottom of inductive device 100, and/or are formed in and/or through magnetic layer 108 at another location on inductive device 100. In some implementations, the plurality of holes are the same size (e.g., the same diameter), the same shape (e.g., circle, oval, square, rectangle, or another shape), and/or the like. In some implementations, two or more holes of the plurality of holes are of a different size, a different shape, and/or the like. In some implementations, the spacing between the plurality of holes is the same spacing. In some implementations, the spacing between at least a subset of the plurality of holes are different spacing distances.

As further shown in FIG. 1A, the plurality of holes (e.g., openings 110) may be configured into a plurality of subsets of holes, where each subset of holes is positioned over a respective conductor 104. In some implementations, each subset of holes includes the same quantity of holes. In some implementations, two or more subsets of holes include different quantities of holes. In some implementations, the holes within a particular subset of holes are the same size, are the same shape, have the same spacing, and/or the like. In some implementations, two or more holes within a particular subset of holes are different sizes, are different shapes, have different spacings, and/or the like.

As shown in FIG. 1B, opening(s) 110 may include one or more trenches in and/or through magnetic layer 108 to insulating layer 106. In some implementations, inductive device 100 includes a single trench in and/or through magnetic layer 108 to insulating layer 106. In some implementations, inductive device 100 includes a plurality of trenches in and/or through magnetic layer 108 to insulating layer 106. Each of the plurality of trenches may have a width, a length, and a depth. The depth of each trench may be equal to or greater than the thickness of magnetic layer 108 such that each trench is completely through magnetic layer 108. In some implementations, the width of a trench is the same along the length of the trench. In some implementations, the width of a trench varies along the length of the trench. In some implementations, the length of a trench spans the entire length (or substantially span the entire length) of magnetic layer 108. In some implementations, the length of a trench spans a subset of the entire length of magnetic layer 108. In some implementations, the plurality of trenches are the same width, the same length, and/or the like. In some implementations, two or more trenches of the plurality of trenches are different widths, a different lengths, and/or the like.

As further shown in FIG. 1B, in some implementations, the plurality of trenches (e.g., openings 110) may be configured such that each of the plurality of trenches is positioned over a respective conductor 104. In some implementations, the plurality of trenches are configured into a plurality of subsets of trenches. In these cases, each subset may include one or more trenches that are positioned over a respective conductor 104. In some implementations, the plurality of subsets of trenches include the same quantity of trenches, the same width of trenches, the same length of trenches, and/or the like. In some implementations, two or more subsets of trenches include different quantities of trenches, different width of trenches, different length of trenches, and/or the like.

In some implementations, if a subset of the plurality of trenches includes two or more trenches (e.g., that each span a subset of the entire length of magnetic layer 108), the trenches within the subset may be the same width, the same shape, and/or the like. In some implementations, if a subset of the plurality of trenches includes two or more trenches (e.g., that each span a subset of the entire length of magnetic layer 108), the trenches within the subset may be different widths, different lengths, and/or the like.

In some implementations, opening(s) 110 may include a combination of one or more holes and one or more trenches in and/or through magnetic layer 108 to insulating layer 106. In other words, opening(s) may include a combination of one or more holes as shown in FIG. 1A and one or more trenches as shown in FIG. 1B. The attributes of the one or more holes and/or the attributes of the one or more trenches may be selected based on one or more performance parameters to be achieved and/or satisfied for inductive device 100.

While FIGS. 1A and 1B provide some example configurations of opening(s) 110, other example configurations may be formed in magnetic layer 108 to provide one or more magnetic leakage paths for inductive device 100. For example, opening(s) 110 may include one or more holes and one or more trenches, may include various combinations of holes and/or trenches, the holes and/or trenches may have various sizes, shapes, spacings, placement, quantity, and/or other parameters.

As shown in FIG. 1C, magnetic layer 108 surrounds and/or encloses insulating layer 102, conductor(s) 104, and insulating layer 106 except where opening(s) 110 are formed in and/or through magnetic layer 108. Magnetic layer 108 may be formed during manufacturing of inductive device 100 from a lower magnetic layer and an upper magnetic layer. The lower magnetic layer and the upper magnetic layer may connect in one or more wings or edges 112 of inductive device 100 such that insulating layer 102 is not exposed through magnetic layer 108 in wing(s) or edge(s) 112. Wing(s) or edge(s) 112 may provide one or more regions in which the upper magnetic layer may be formed on one or more portions of the lower magnetic layer after formation of insulating layer 102, conductor(s) 104, and insulating layer 106. Example dimensions of wing(s) or edge(s) 112 include a 10 μm height and a 10 μm width. However, other dimensions may be used for wing(s) or edge(s) 112.

In some implementations, an electrical current flows through conductor(s) 104 to generate magnetic flux, which may be enhanced through the use of magnetic layer 108. Surrounding and/or enclosing the components of inductive device 100 with magnetic layer 108 confines the magnetic flux to increase the inductance of inductive device 100. Opening(s) 110 in and/or through magnetic layer 108 provide one or more magnetic leakage paths for the magnetic flux to increase the saturation current of inductive device 100. Moreover, opening(s) 110 may be formed in and/or through magnetic layer 108 by one or more semiconductor processes that are highly accurate, precise, and repeatable, such as forming opening(s) 110 in and/or through magnetic layer 108 by using one or more of a lithography process and/or an etching process. In this way, defects and/or variations in size and/or shape between opening(s) 110 (and thus, magnetic leakage paths) of inductive device 100, and from inductive device 100 to other inductive devices, are reduced to provide consistent performance.

As indicated above, FIGS. 1A-1C are provided as one or more examples. Other examples may differ from what is described with regard to FIGS. 1A-1C.

FIGS. 2A-2J are diagrams of one or more example implementations 200 described herein. Example implementation(s) 200 illustrate one or more example techniques of forming an inductive device such as inductive device 100. In some implementations, the one or more example techniques may be used to form other inductive devices. In some implementations, other techniques and/or differently ordered techniques may be used to form inductive device 100 and/or other inductive devices.

Figure 2A:
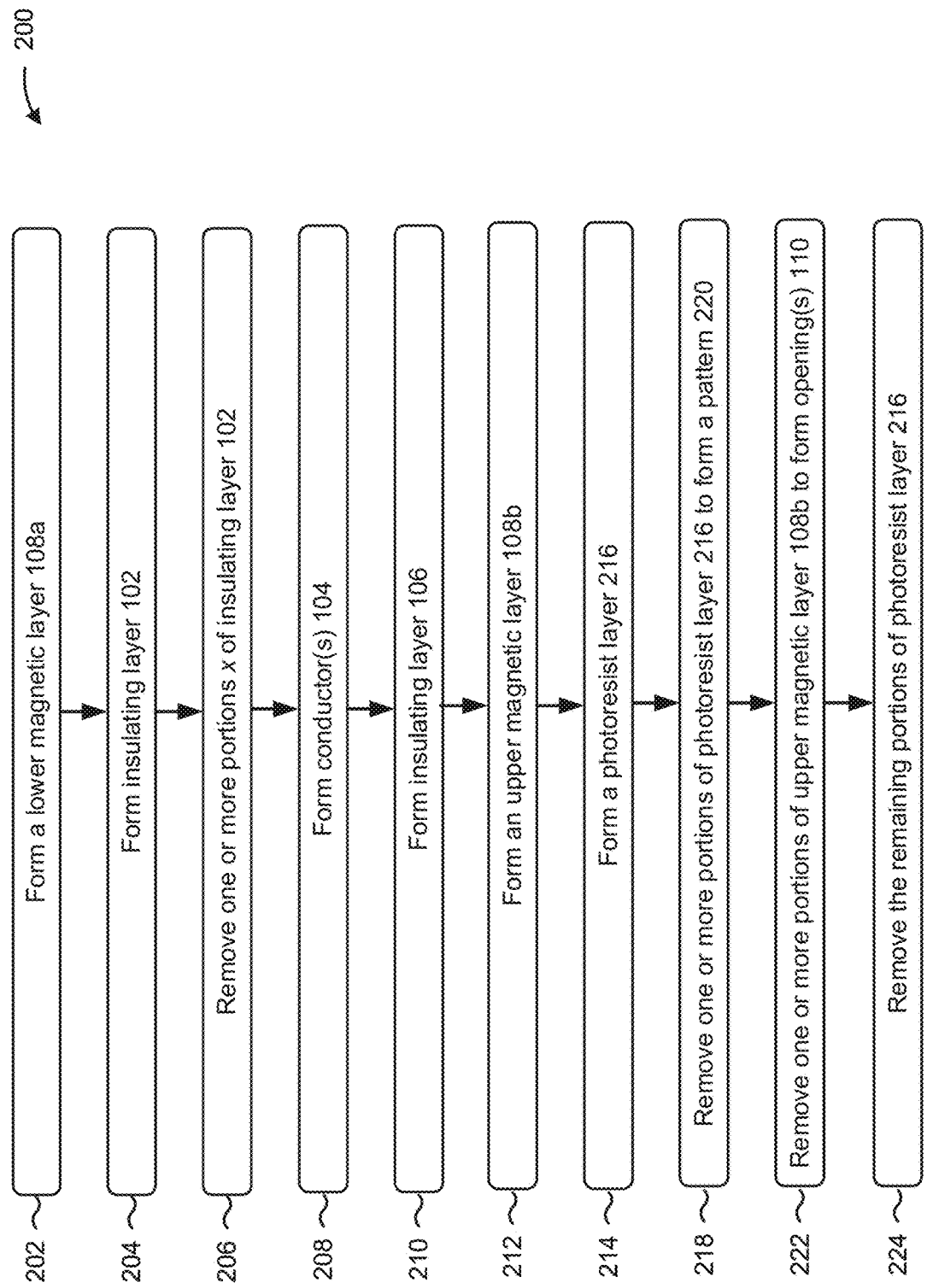
FIGS. 2A-2J are diagrams of one or more example implementations described herein.

As shown in FIG. 2A, example implementation(s) 200 may include forming lower magnetic layer 108a (block 202), forming insulating layer 102 (block 204), removing one or more portions x of insulating layer 102 (block 206), forming conductor(s) 104 (block 208), forming insulating layer 106 (block 210), forming upper magnetic layer 108b (block 212), forming a photoresist layer 216 (block 214), removing one or more portions of photoresist layer 216 to form a pattern 220 (block 218), removing one or more portions of upper magnetic layer 108b to form opening(s) 110 (block 220), and removing the remaining portions of photoresist layer 216 (block 224).

Figure 2B:
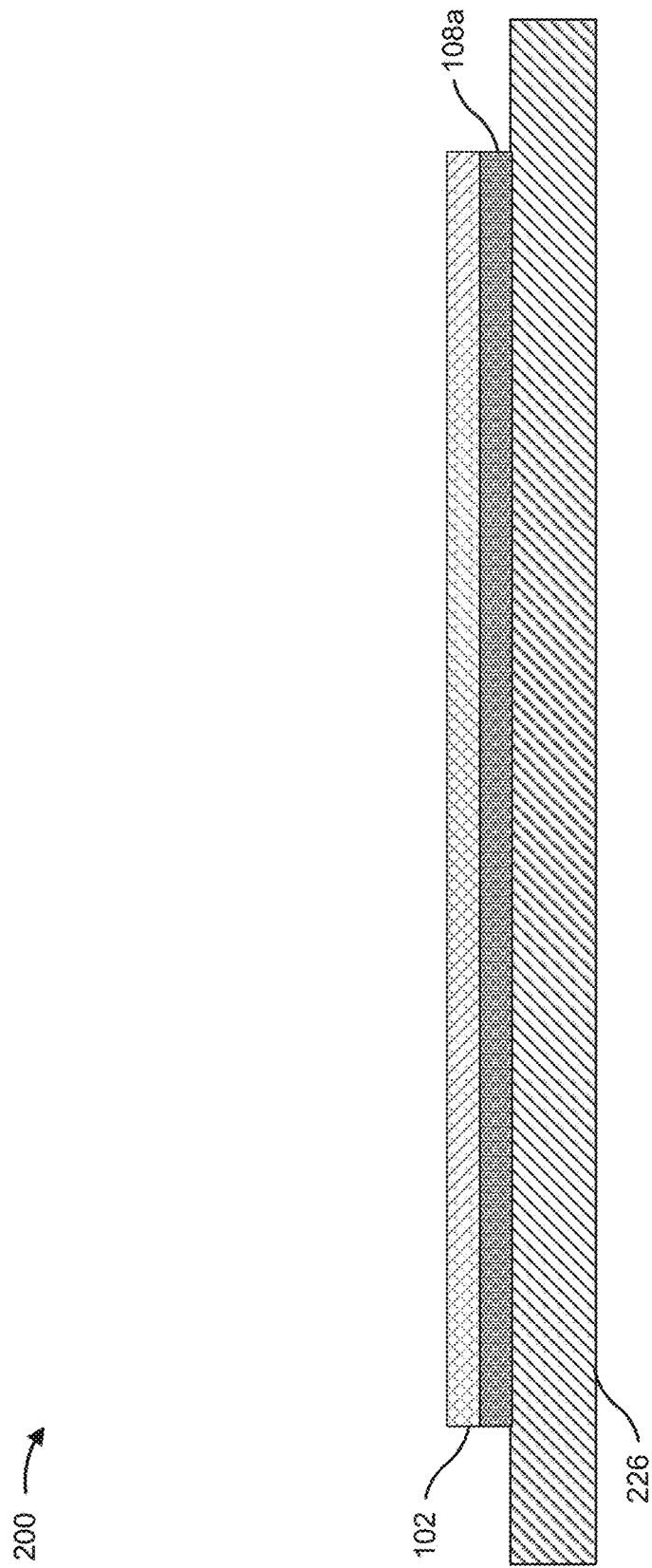

As shown in FIG. 2B, at block 202, a semiconductor processing device (e.g., one or more of the semiconductor processing devices illustrated and described below in connection with FIG. 4) forms a lower magnetic layer 108a. In some implementations, the semiconductor processing device forms lower magnetic layer 108a on a substrate 226 such as a semiconductor wafer or a layer of a semiconductor wafer. In some implementations, the semiconductor processing device forms lower magnetic layer 108a using various semiconductor processing techniques, such as chemical vapor deposition (e.g., epitaxial growing and/or the like), physical vapor deposition (e.g., sputtering and/or the like), plating (e.g., electroplating and/or the like), and/or the like.

As further shown in FIG. 2B, at block 204, a semiconductor processing device (e.g., one or more of the semiconductor processing devices illustrated and described below in connection with FIG. 4) forms insulating layer 102 on lower magnetic layer 108a. In some implementations, the semiconductor processing device forms insulating layer 102 using a coating technique such as a spin coating technique. The spin coating technique may include depositing an amount of dielectric material onto lower magnetic layer 108a and rotating or spinning the wafer on which lower magnetic layer 108a is formed to distribute the dielectric material across lower magnetic layer 108a to form insulating layer 102.

Figure 2C:
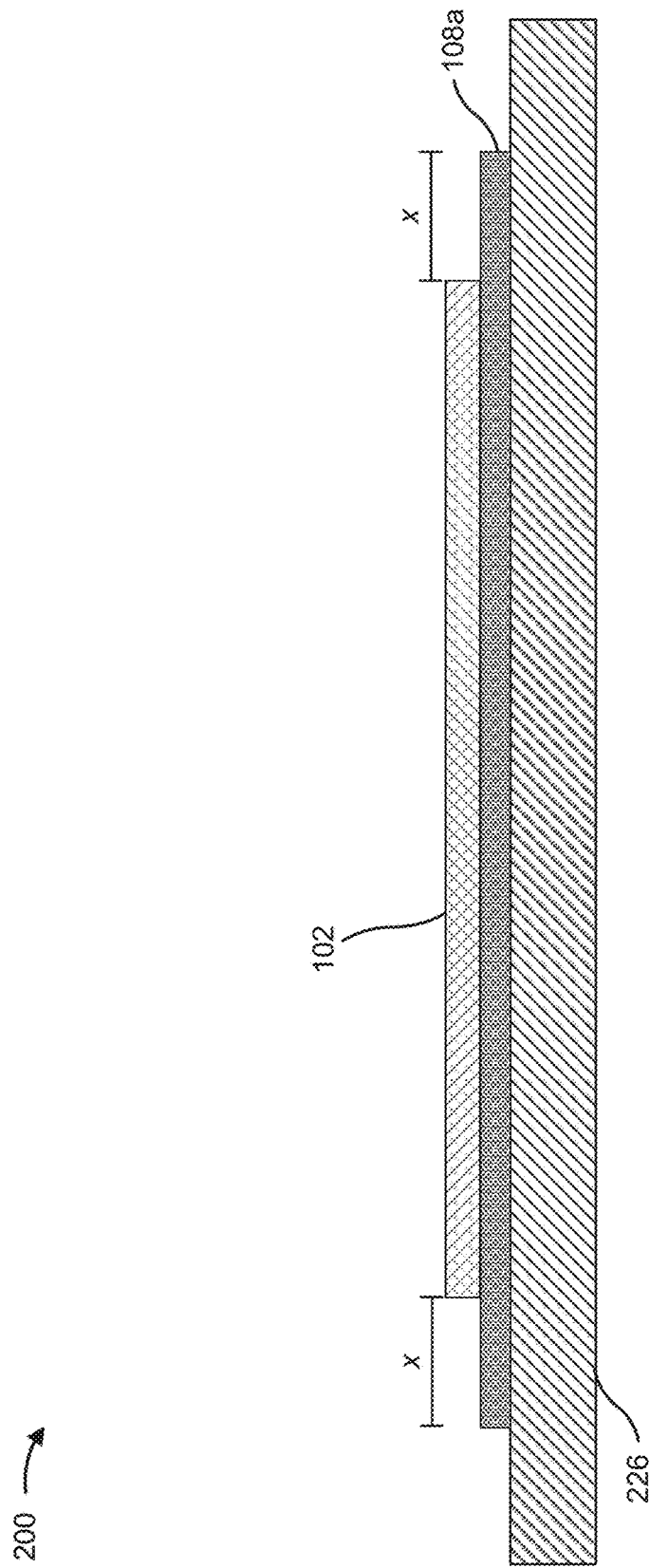

As shown in FIG. 2C, at block 206, a semiconductor processing device (e.g., one or more of the semiconductor processing devices illustrated and described below in connection with FIG. 4) removes one or more portions of insulating layer 102 (indicated by x in FIG. 2C). For example, a semiconductor processing device may form a photoresist layer on insulating layer 102, a semiconductor processing device may expose the photoresist layer to a radiation source to pattern the photoresist layer, a semiconductor processing device may develop and remove portions of the photoresist layer to expose the pattern, a semiconductor processing device may etch the one or more portions of insulating layer 102 to remove the one or more portions from lower magnetic layer 108a, and a semiconductor processing device may remove the remaining portions of the photoresist layer after etching insulating layer 102 (e.g., using a chemical stripper and/or another technique). In some examples, the width of the one or more portions (e.g., the width of x) is 10 μm. In other examples, other widths of the one or more portions (e.g., the width of x) are removed.

Figure 2D:
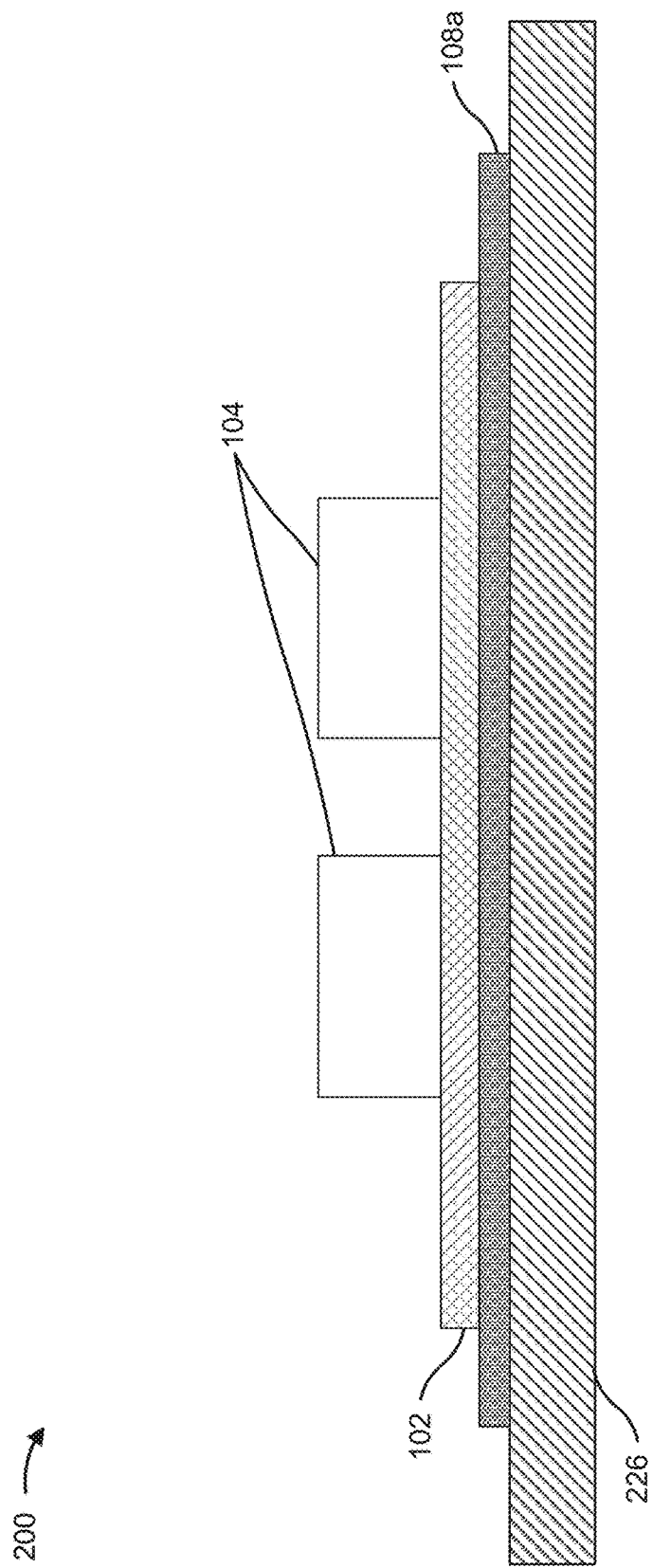

As shown in FIG. 2D, at block 208, a semiconductor processing device (e.g., one or more of the semiconductor processing devices illustrated and described below in connection with FIG. 4) forms conductor(s) 104 on insulating layer 102. In some implementations, the semiconductor processing device forms conductor(s) 104 on insulating layer 102 using various semiconductor processing techniques. For example, the semiconductor processing device may form conductor(s) 104 using a chemical vapor deposition process (e.g., epitaxial growing and/or the like), a physical vapor deposition process (e.g., sputtering and/or the like), a plating process (e.g., electroplating and/or the like), or using another processing technique. In some implementations, a semiconductor processing device polishes or planarize conductor(s) 104 after formation of conductor(s) 104. Moreover, if a pattern in a photoresist layer is used to form conductor(s) 104, a semiconductor processing device may remove the remaining portions of the photoresist layer after formation of conductor(s) 104.

Figure 2E:
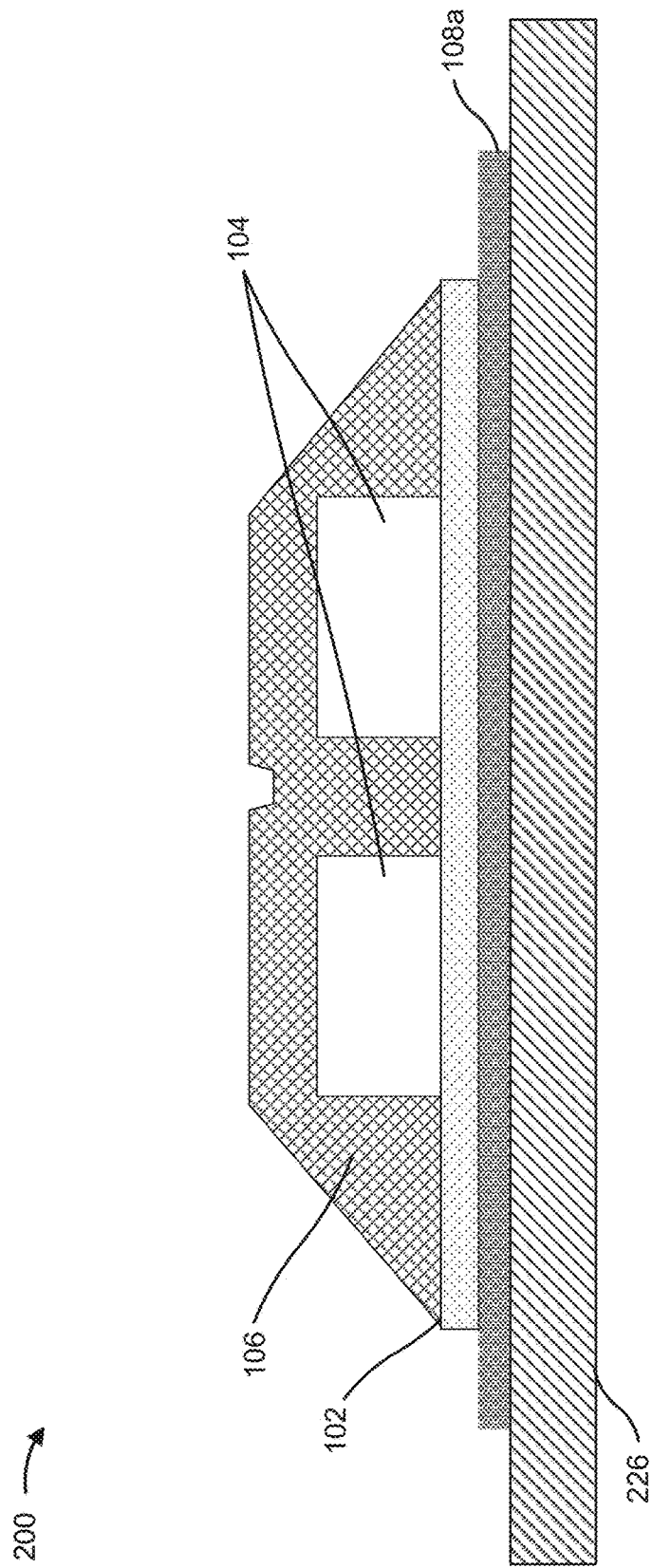

As shown in FIG. 2E, at block 210, a semiconductor processing device (e.g., one or more of the semiconductor processing devices illustrated and described below in connection with FIG. 4) forms insulating layer 106. For example, the semiconductor processing device may form insulating layer 106 above lower magnetic layer 108a, insulating layer 102, and conductor(s) 104 such that insulating layer 106 is formed on and/or over one or more portions of insulating layer 102 and/or one or more potions of conductor(s) 104. In some implementations, the semiconductor processing device forms insulating layer 106 using a coating technique such as a spin coating technique. The spin coating technique may include depositing an amount of dielectric material onto insulating layer 102 and conductor(s) 104, and rotating or spinning the wafer on which lower magnetic layer 108a is formed to distribute the dielectric material across insulating layer 102 and conductor(s) 104 to form insulating layer 106. In some implementations, insulating layer 102 and insulating layer 106 form a single and/or unified insulating layer of inductive device 100.

Figure 2F:
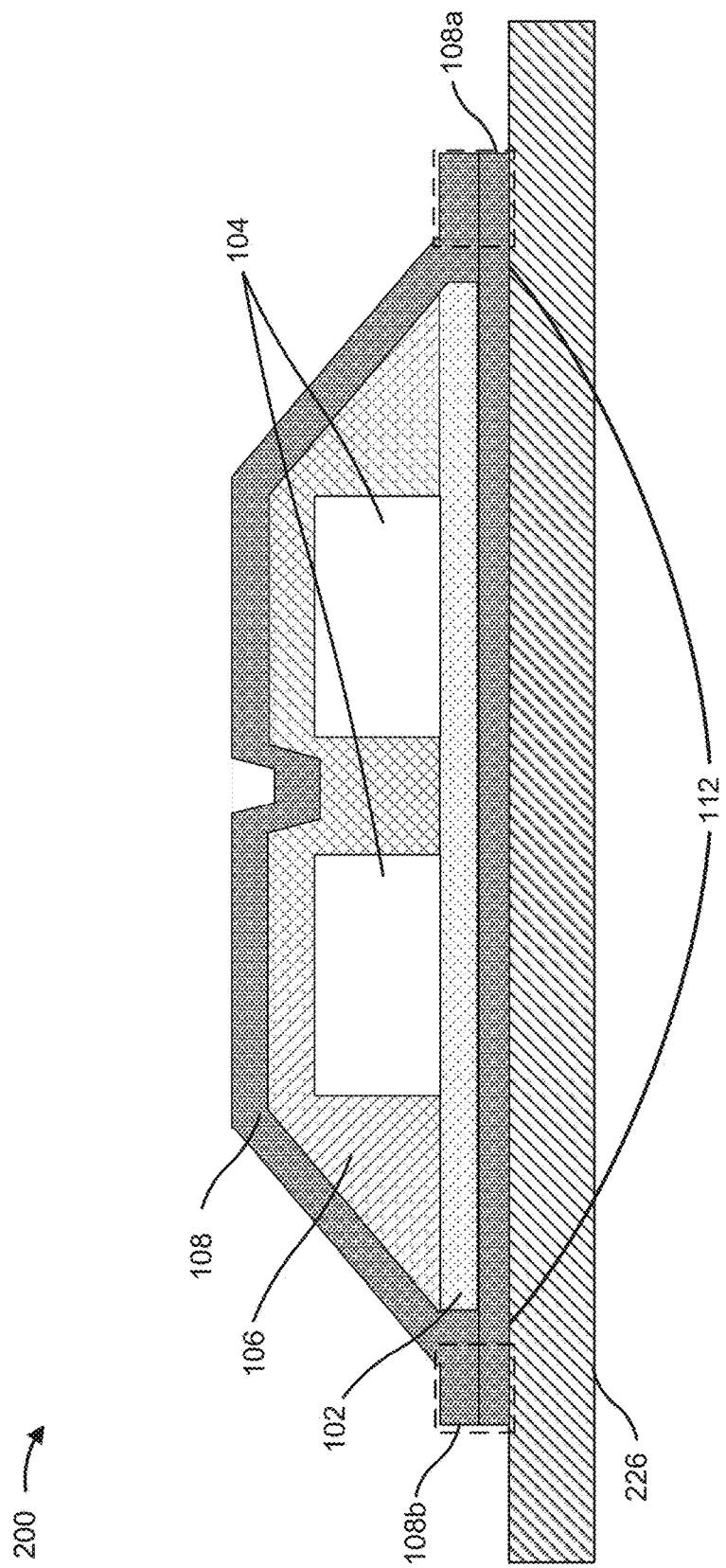

As shown in FIG. 2F, at block 212, a semiconductor processing device (e.g., one or more of the semiconductor processing devices illustrated and described below in connection with FIG. 4) forms an upper magnetic layer 108b. In some implementations, the semiconductor processing device forms upper magnetic layer 108b above lower magnetic layer 108a, insulating layer 102, conductor(s) 104, and insulating layer 106 such that upper magnetic layer 108b is formed on and/or over one or more portions of lower magnetic layer 108a (e.g., one or more portions in edge(s) 112 of inductive device 100) and one or more portions of insulating layer 106. In these cases, the ends of upper magnetic layer 108b contacts the ends of lower magnetic layer 108a to form wings or edge(s) 112 of inductive device 100. As a result, any gaps between the ends of lower magnetic layer 108a and upper magnetic layer 108b in the wings or edge(s) 122 are closed to form a continuous magnetic layer 108 around inductive device 100. Accordingly, magnetic layer 108 surrounds insulating layer 102, conductor(s) 104, and insulating layer 106. In some implementations, the semiconductor processing device forms upper magnetic layer 108b using various semiconductor processing techniques, such as chemical vapor deposition (e.g., epitaxial growing and/or the like), physical vapor deposition (e.g., sputtering and/or the like), plating (e.g., electroplating and/or the like), or another semiconductor processing technique. Moreover, a semiconductor processing device may polish or planarize upper magnetic layer 108b after formation of upper magnetic layer 108b.

Figure 2G:
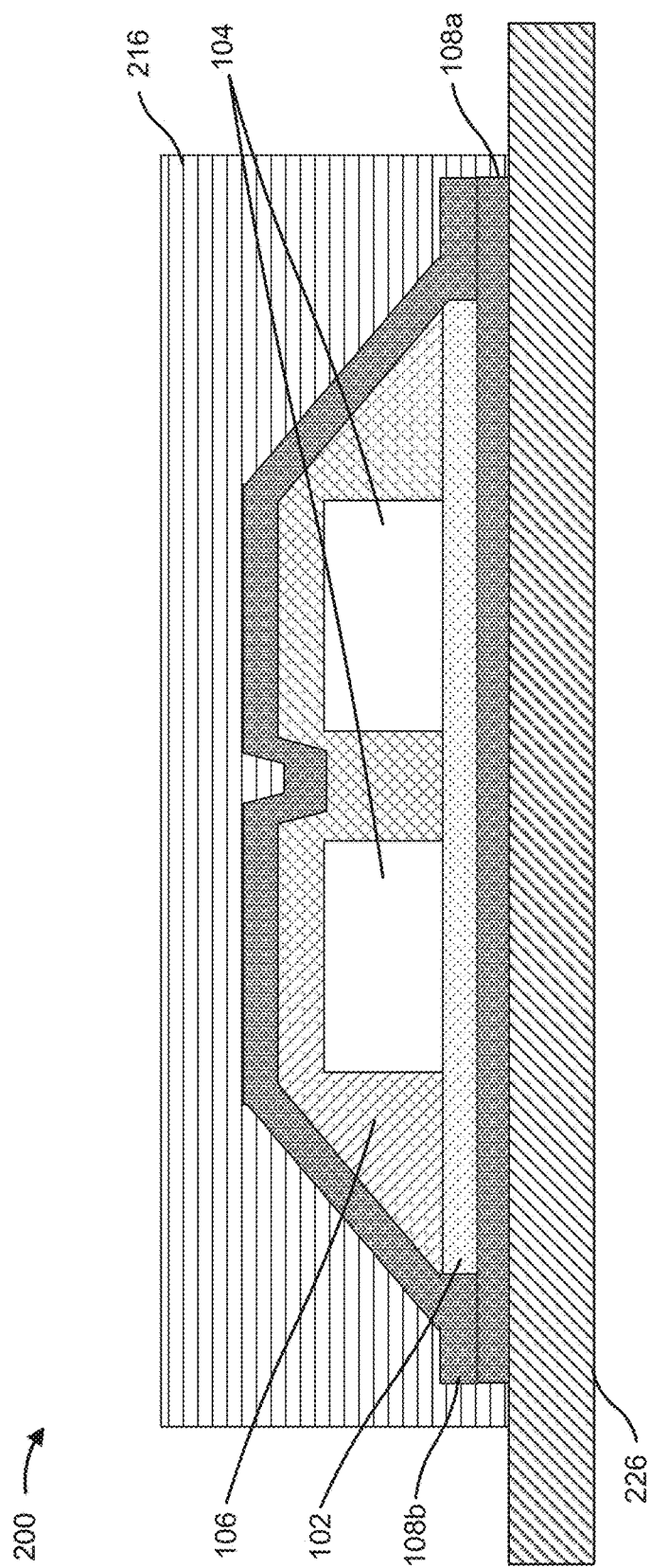

As shown in FIG. 2G, at block 214, a semiconductor processing device (e.g., one or more of the semiconductor processing devices illustrated and described below in connection with FIG. 4) forms a photoresist layer 216. In some implementations, the semiconductor processing device forms photoresist layer 216 on and/or around upper magnetic layer 108b. Photoresist layer 216 may include a layer of radiation sensitive material capable of being patterned via exposure to a radiation source. In some implementations, the semiconductor processing device forms photoresist layer 216 using a coating technique such as a spin coating technique. The spin coating technique may include depositing an amount of photoresist material onto upper magnetic layer 108b, and rotating or spinning the wafer on which lower magnetic layer 108a is formed to distribute the photoresist material across upper magnetic layer 108b to form photoresist layer 216.

Figure 2H:
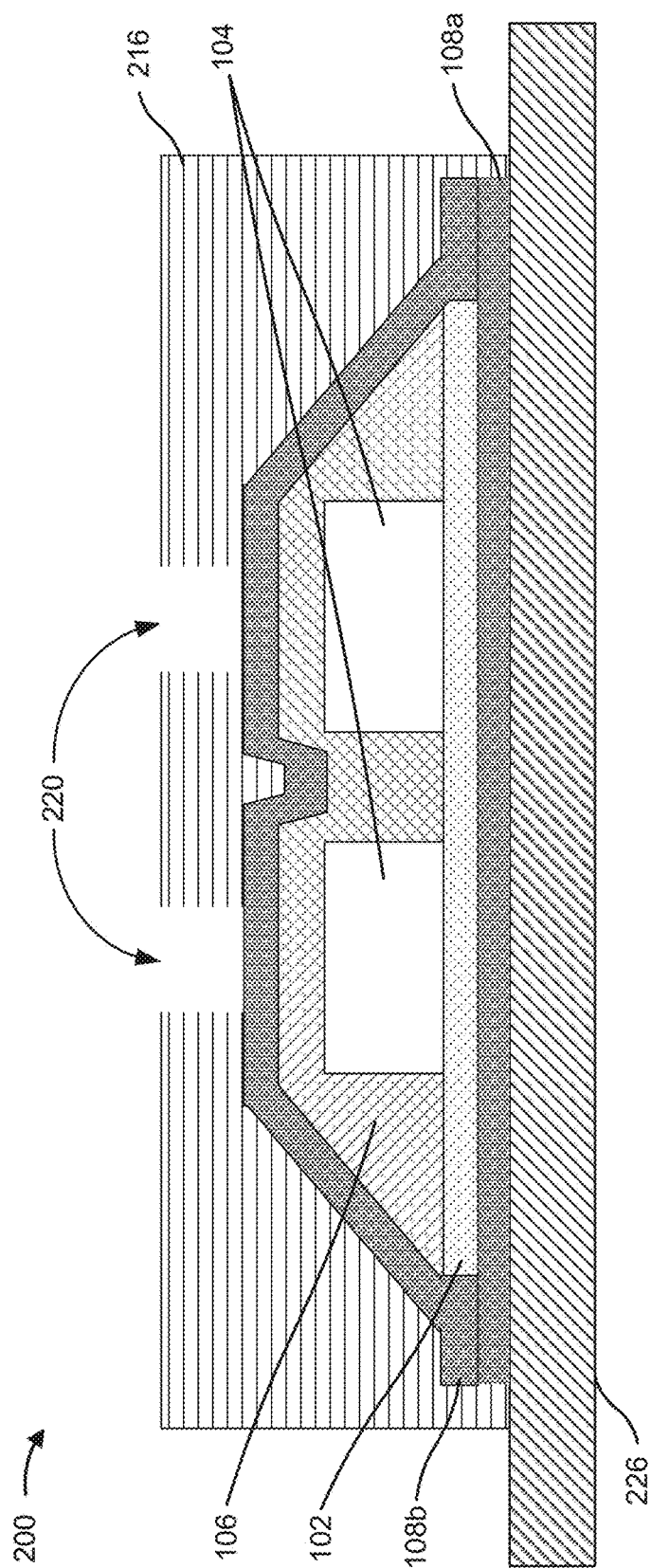

As shown in FIG. 2H, at block 218, a semiconductor processing device (e.g., one or more of the semiconductor processing devices illustrated and described below in connection with FIG. 4) removes one or more portions of photoresist layer 216 to form a pattern 220 in photoresist layer 216. For example, a semiconductor processing device may expose the photoresist layer 216 to a radiation source to transfer pattern 220 from a photomask to photoresist layer 216, and a semiconductor processing device may develop and remove the one or more portions of photoresist layer 216 to expose pattern 220. The remaining portions of photoresist layer 216 may form one or more openings in photoresist layer 216 that may be used to form opening(s) 110 through upper magnetic layer 118b. In some implementations, the size, shape, and/or configuration of the one or more portions removed from photoresist layer 216 to form pattern 220 are based on the size, shape, configuration, and/or quantity of opening(s) 110 to be formed in upper magnetic layer 118b.

Figure 2I:
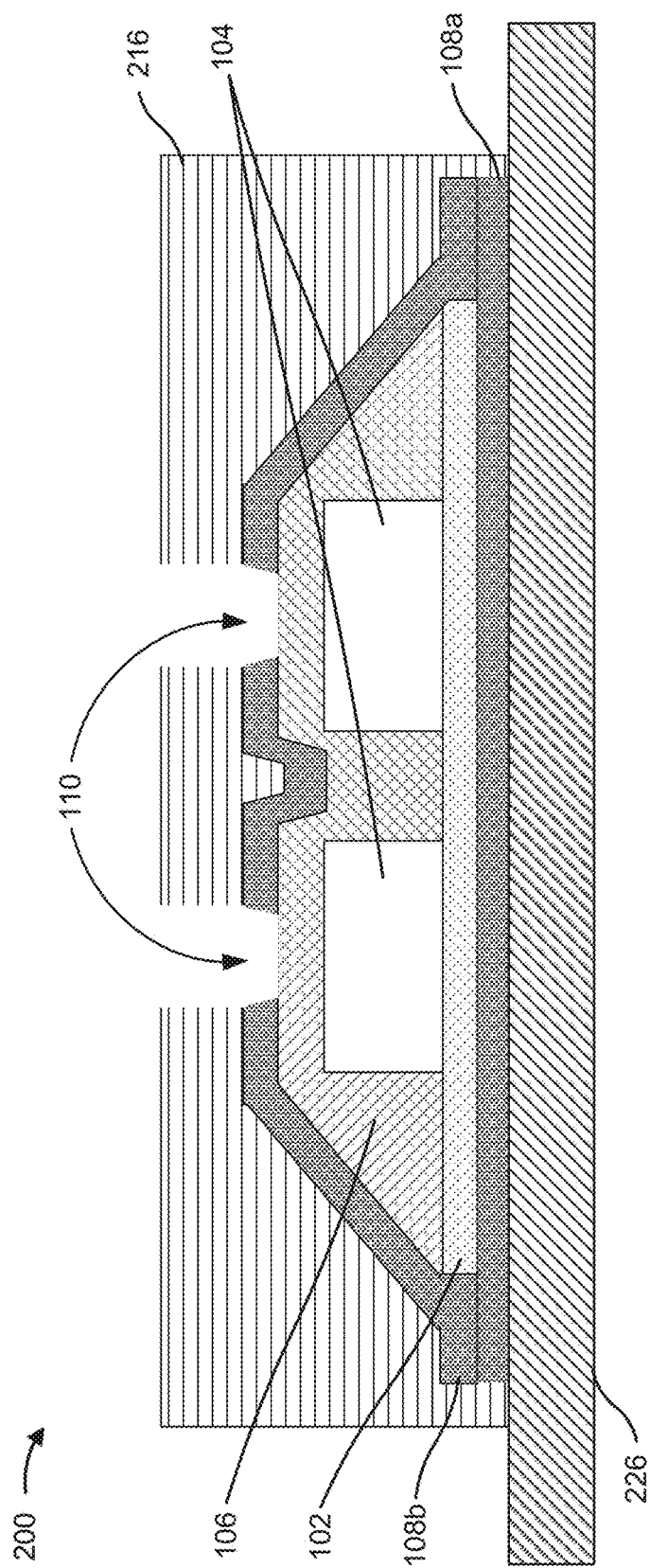

As shown in FIG. 2I, at block 222, a semiconductor processing device (e.g., one or more of the semiconductor processing devices illustrated and described below in connection with FIG. 4) removes one or more portions of upper magnetic layer 108b to form opening(s) 110. For example, the semiconductor processing device may form opening(s) 110 in and/or through upper magnetic layer 108b to insulating layer 106 to provide one or more magnetic leakage paths for inductive device 100 (e.g., for conductor(s) 104). In some implementations, the semiconductor processing device etches opening(s) 110 in and/or through upper magnetic layer 108b using a wet etching technique, using a dry etching technique, and/or the like. In some implementations, the semiconductor processing device etches opening(s) 110 in and/or through upper magnetic layer 108b based on pattern 220 in photoresist layer 216. For example, the semiconductor processing device may etch opening(s) 110 in and/or through upper magnetic layer 108b in the one or more portions removed from photoresist layer 216 to form pattern 220. In some aspects, the semiconductor processing device forms opening(s) 110 through the portion(s) of upper magnetic layer 108b such that the opening(s) 110 are above conductor(s) 104. In some aspects, the semiconductor processing device forms opening(s) 110 through the portion(s) of upper magnetic layer 108b such that the opening(s) 110 are positioned to the side(s) of conductor(s) 104 or at other locations relative to conductor(s) 104.

Figure 2J:
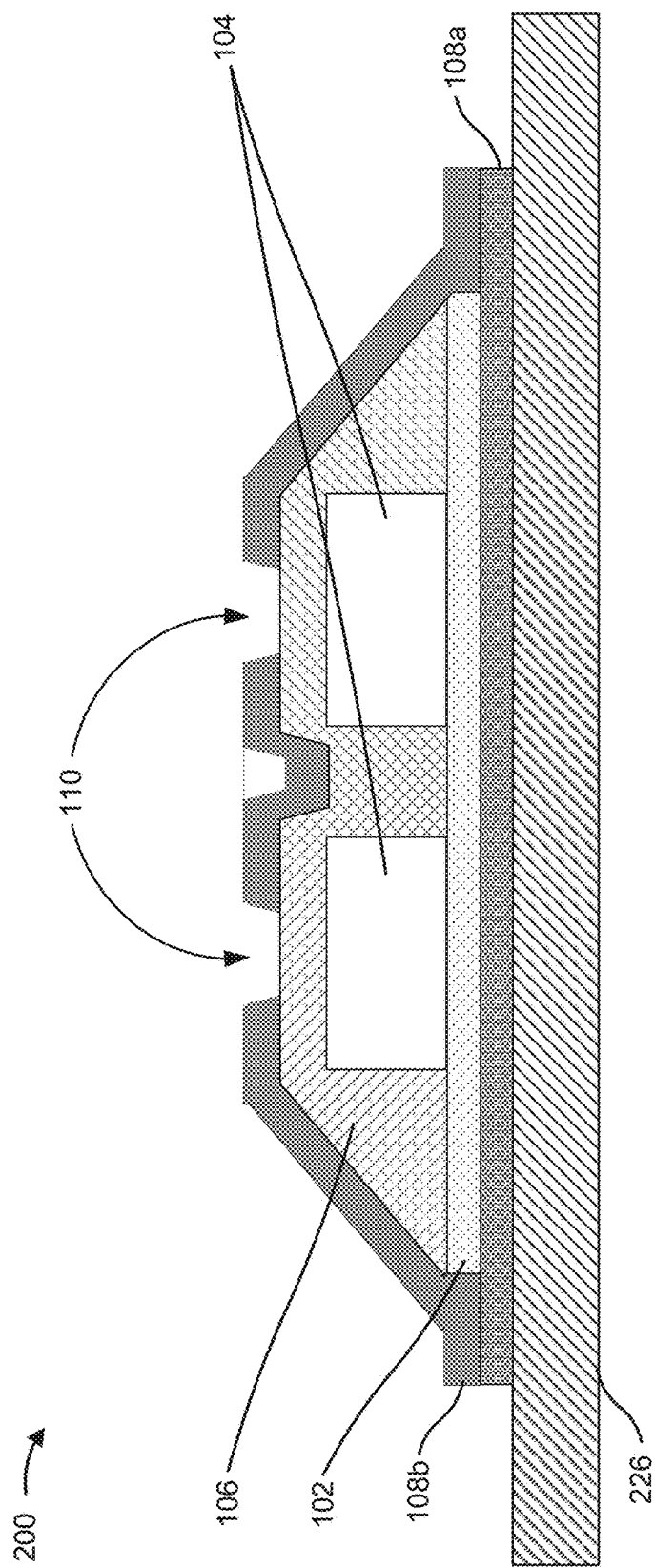

As shown in FIG. 2J, at block 224, a semiconductor processing device (e.g., one or more of the semiconductor processing devices illustrated and described below in connection with FIG. 4) removes the remaining portions of photoresist layer 216. For example, the semiconductor processing device may use one or more solvents and/or other types of chemicals to remove or strip the remaining portions of photoresist layer 216 from upper magnetic layer 108b. The remaining portions of photoresist layer 216 may be removed after opening(s) 110 are etched in and/or through upper magnetic layer 108b.

As indicated above, FIGS. 2A-2J are provided as one or more examples. Other examples may differ from what is described with regard to FIGS. 2A-2J. As an example, in addition and/or alternatively to forming opening(s) 110 in upper magnetic layer 108b using the techniques illustrated and described in connection with reference numbers 214-224, opening(s) 110 may be formed in lower magnetic layer 108a, may be formed in different locations in upper magnetic layer 108b, and/or lower magnetic layer 108a, and/or the like.

Figure 3:
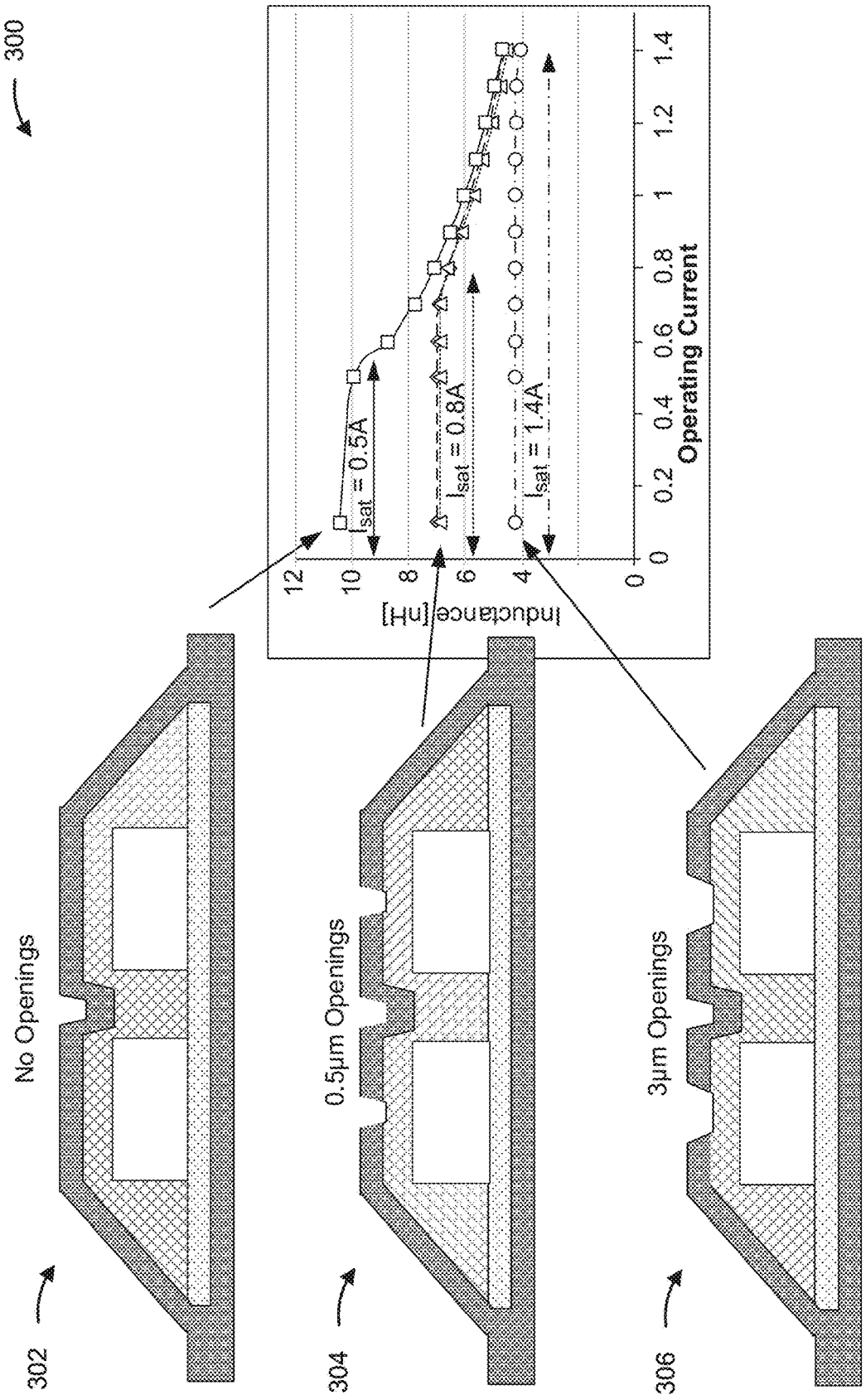
FIG. 3 is a diagram illustrating example performance parameters associated with a plurality of example inductive devices described herein.

FIG. 3 is a diagram illustrating example performance parameters associated with a plurality of example inductive devices described herein.

As shown in FIG. 3, the plurality of example inductive devices (e.g., inductive device 302, inductive device 304, and inductive device 306) may have different performance parameters based on the magnetic leakage paths (or lack of magnetic leakage paths) included in the plurality of inductive devices. The performance parameters may include an inductance and a saturation current ($I_{sat}$). The inductance may be a maximum inductance or an initial inductance in nanohenrys (nH) at a low-end or minimum operating current of an inductive device in amps (A). The saturation current may be an operating current at which the inductance of an inductive device drops below a particular inductive level or drops to a particular percentage (e.g., 80% or another percentage) of the maximum inductance or the initial inductance of the inductive device.

As shown in FIG. 3, inductive device 302 is formed with no openings and, thus, no magnetic leakage paths for inductive device 302. As shown, the graph of performance parameters for inductive device 302, exhibits a relatively large maximum inductance or initial inductance. However, due to the lack of magnetic leakage paths, inductive device 302 exhibits a relatively quick drop in inductance as operating current increases, which corresponds to a relatively low saturation current (e.g., $I_{sat}$=0.5 A).

As further shown in FIG. 3, opening(s) can be added through one or more magnetic layers of an inductive device to provide magnetic leakage path(s), which may increase saturation current at the expense of maximum inductance or initial inductance. For example, inductive device 304 (which may be an example implementation of inductive device 100) may include openings in the form of holes having a 0.5 µm diameter. As shown in the graph illustrated in FIG. 3, the 0.5 µm diameter holes through the magnetic layer (e.g., the upper magnetic layer) of inductive device 304 increases the saturation current of inductive device 304 to $I_{sat}$=0.8 A relative to inductive device 302, while decreasing the maximum inductance or the initial inductance of inductive device 304 relative to inductive device 302. As another example, inductive device 306 (which may be another example implementation of inductive device 100) may include openings in the form of holes having a 3 µm diameter. As shown in the graph illustrated in FIG. 3, the 3 µm diameter holes through the magnetic layer (e.g., the upper magnetic layer) of inductive device 306 increases the saturation current of inductive device 304 to $I_{sat}$=1.4 A relative to inductive device 302, while decreasing the maximum inductance or the initial inductance of inductive device 304 relative to inductive device 302.

Accordingly, the opening(s) through one or more magnetic layers of an inductive device can be configured for various applications and/or operating environments of the inductive device, to satisfy one or more design goals of the inductive device, to satisfy one or more performance parameters (e.g., to satisfy a maximum inductance or initial inductance threshold, to satisfy a saturation current threshold, and/or the like), and/or the like. Moreover, the saturation current of an inductive device may be more difficult to control relative to the maximum inductance or the initial inductance of the inductive device, and other parameters of an inductive device may be adjusted or configured to increase maximum inductance or initial inductance while providing a suitable saturation current through the use of openings in one or more magnetic layers of the inductive device. For example, the maximum inductance or the initial inductance of the inductive device may be increased by adjusting the length of the inductive device, by adjusting the thickness of the one or more magnetic layers, and/or the like.

As indicated above, FIG. 3 is provided as one or more examples. Other examples may differ from what is described with regard to FIG. 3.

Figure 4:
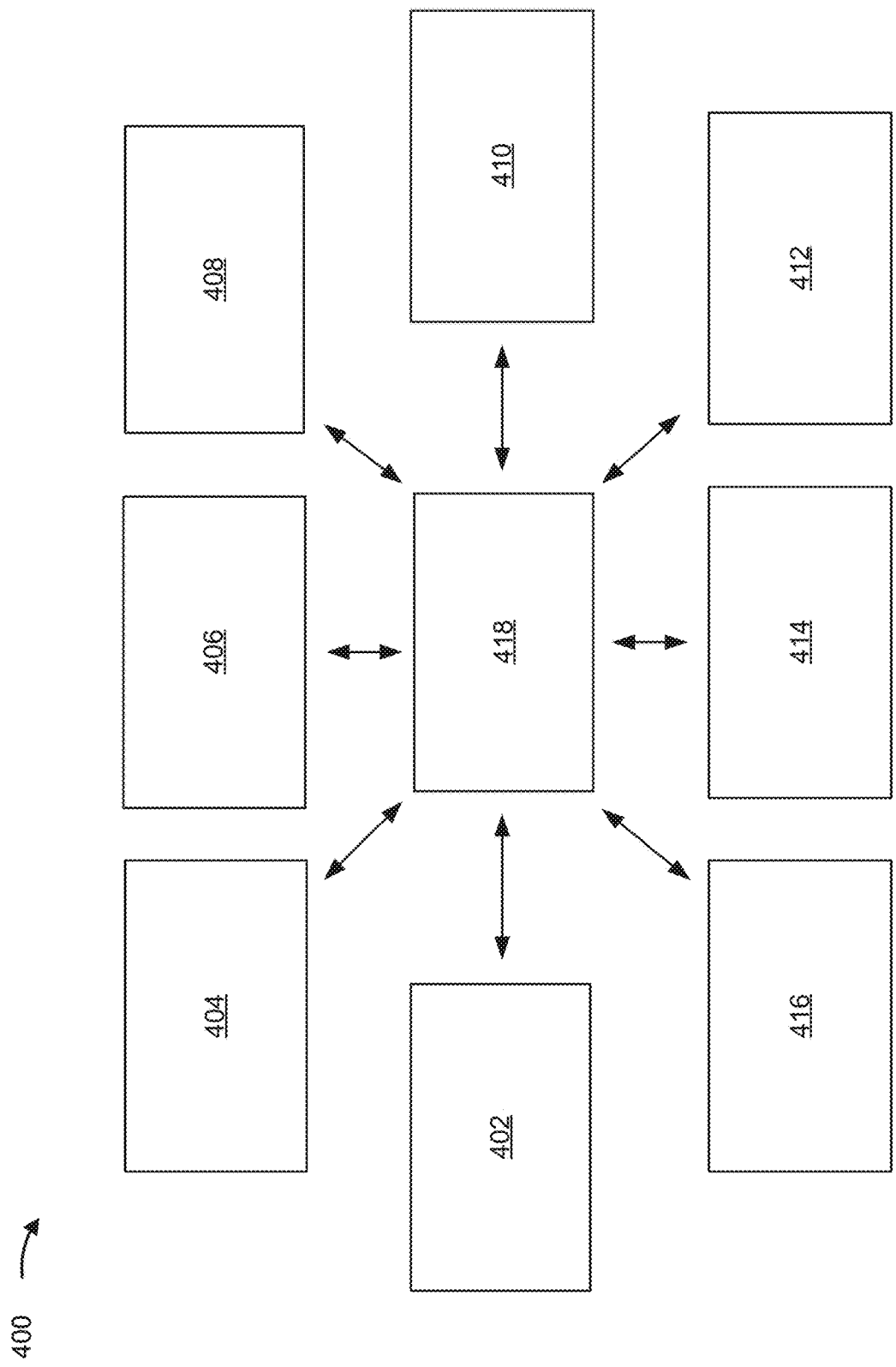
FIG. 4 is a diagram of an example environment in which systems and/or methods described herein may be implemented.

FIG. 4 is a diagram of an example environment 400 in which systems and/or methods described herein may be implemented. As shown in FIG. 4, environment 400 may include a plurality of semiconductor processing devices 402-416 and a wafer/die transport device 418. The plurality of semiconductor processing devices 402-416 may include a coating device 402, an exposure device 404, a developer device 406, a plating device 408, a deposition device 410, an etching device 412, a polishing device 414, a removal device 416, and/or other the like. The devices included in example environment 400 may be included in a semiconductor clean room, a semiconductor foundry, a semiconductor processing and/or manufacturing facility, and/or the like.

Coating device 402 includes one or more devices capable of forming various types of layers on a substrate by a spin coating process or another type of coating process. For example, coating device 402 may form one or more insulating layers (e.g., insulating layer 102, insulating layer 106, and/or the like), may form a photoresist layer (e.g., photoresist layer 216), and/or the like as described herein. Photoresist layer 216 may include a layer of radiation sensitive material capable of being patterned via exposure to a radiation source, such as an ultraviolet light (UV) source (e.g., a deep UV light source, an extreme UV light source, and/or the like), an x-ray source, and/or the like.

Exposure device 404 includes one or more devices capable of exposing a photoresist layer (e.g., photoresist layer 216) to a radiation source, such as an ultraviolet light (UV) source (e.g., a deep UV light source, an extreme UV light source, and/or the like), an x-ray source, and/or the like. Exposure device 404 may expose the photoresist layer to the radiation source to transfer a pattern from a photomask to the photoresist layer. The pattern may include one or more semiconductor device layer patterns for forming one or more semiconductor devices, may include a pattern for forming openings (e.g., openings 110) in an inductive device (e.g., inductive device 100), and/or the like. In some implementations, exposure device 404 is a scanner, a stepper, or a similar type of exposure device.

Developer device 406 includes one or more devices capable of developing a photoresist layer (e.g., photoresist layer 216) that has been exposed to a radiation source to develop a pattern transferred to the photoresist layer from exposure device 404. In some implementations, developer device 406 develops the pattern by removing unexposed portions of the photoresist layer. In some implementations, developer device 406 develops the pattern by removing exposed portions of the photoresist layer. In some implementations, developer device 406 develops the pattern by dissolving exposed or unexposed portions of the photoresist layer through the use of a chemical developer.

Plating device 408 includes one or more devices capable of plating a substrate or a portion thereof with one or more metals. For example, plating device 408 may include a copper electroplating device, an aluminum electroplating device, a nickel electroplating device, a tin electroplating device, a compound material or alloy (e.g., tin-silver, tin-lead, and/or the like) electroplating device, and/or an electroplating device for one or more other types of conductive materials, metals, and/or the like. In some implementations, plating device 408 is capable of forming one or more conductors (e.g., conductor(s) 104), one or more magnetic layers (e.g., magnetic layer 108a, magnetic layer 108b, and/or the like), and/or the like as described herein.

Deposition device 410 includes one or more devices capable of depositing various types of materials onto a substrate. For example, deposition device 410 may include a chemical vapor deposition device (e.g., an electrostatic spray device, an epitaxy device, and/or another type of chemical vapor deposition device), a physical vapor deposition device (e.g., a sputtering device and/or another type of physical vapor deposition device), and/or the like. In some implementations, deposition device 410 deposits a magnetic layer (e.g., lower magnetic layer 108a, upper magnetic layer 108b, and/or the like) of an inductive device (e.g., inductive device 100), deposits a metal material to form one or more conductors (e.g., conductor(s) 104) of the inductive device, and/or the like as described herein.

Etching device 412 includes one or more devices capable of etching various types of materials. For example, etching device 412 may include a wet etching device, a dry etching device, and/or the like. In some implementations, etching device 412 etches one or more openings in a magnetic layer (e.g., upper magnetic layer 108b) of an inductive device (e.g., inductive device 100), etches one or more portions of an insulating layer (e.g., insulating layer 102) of the inductive device, and/or the like as described herein.

Polishing device 414 includes one or more devices capable of polishing or planarizing various layers of an inductive device (e.g., inductive device 100). For example, polishing device 414 may include a chemical mechanical polishing device and/or another type of polishing device. In some implementations, polishing device 414 polishes or planarize a layer of deposited or plated material as part of the formation of one or more conductors (e.g., conductor(s) 104) of the inductive device, one or more magnetic layers (e.g., lower magnetic layer 108a, upper magnetic layer 108b, and/or the like) of the inductive device, and/or the like.

Removal device 416 includes one or more devices capable of removing or stripping a photoresist layer (e.g., photoresist layer 216). In some implementations, removal device 416 is capable of using one or more solvents and/or other types of chemicals to remove or strip the photoresist layer from one or more other layers after the photoresist layer has been exposed to a radiation source by exposure device 404 and used to form a pattern in one or more other layers.

Wafer/die transport device 418 includes a mobile robot, a robot arm, a tram or rail car, and/or another type of device that are used to transport wafers and/or dies between semiconductor processing devices 402-416 and/or to and from other locations such as a wafer rack, a storage room, and/or the like. In some implementations, wafer/die transport device 418 is a programmed device to travel a particular path, operates semi-autonomously, or operates autonomously.

The number and arrangement of devices shown in FIG. 4 are provided as one or more examples. In practice, there may be additional devices, fewer devices, different devices, or differently arranged devices than those shown in FIG. 4. Furthermore, two or more devices shown in FIG. 4 may be implemented within a single device, or a single device shown in FIG. 4 may be implemented as multiple, distributed devices. Additionally, or alternatively, a set of devices (e.g., one or more devices) of environment 400 may perform one or more functions described as being performed by another set of devices of environment 400.

Figure 5:
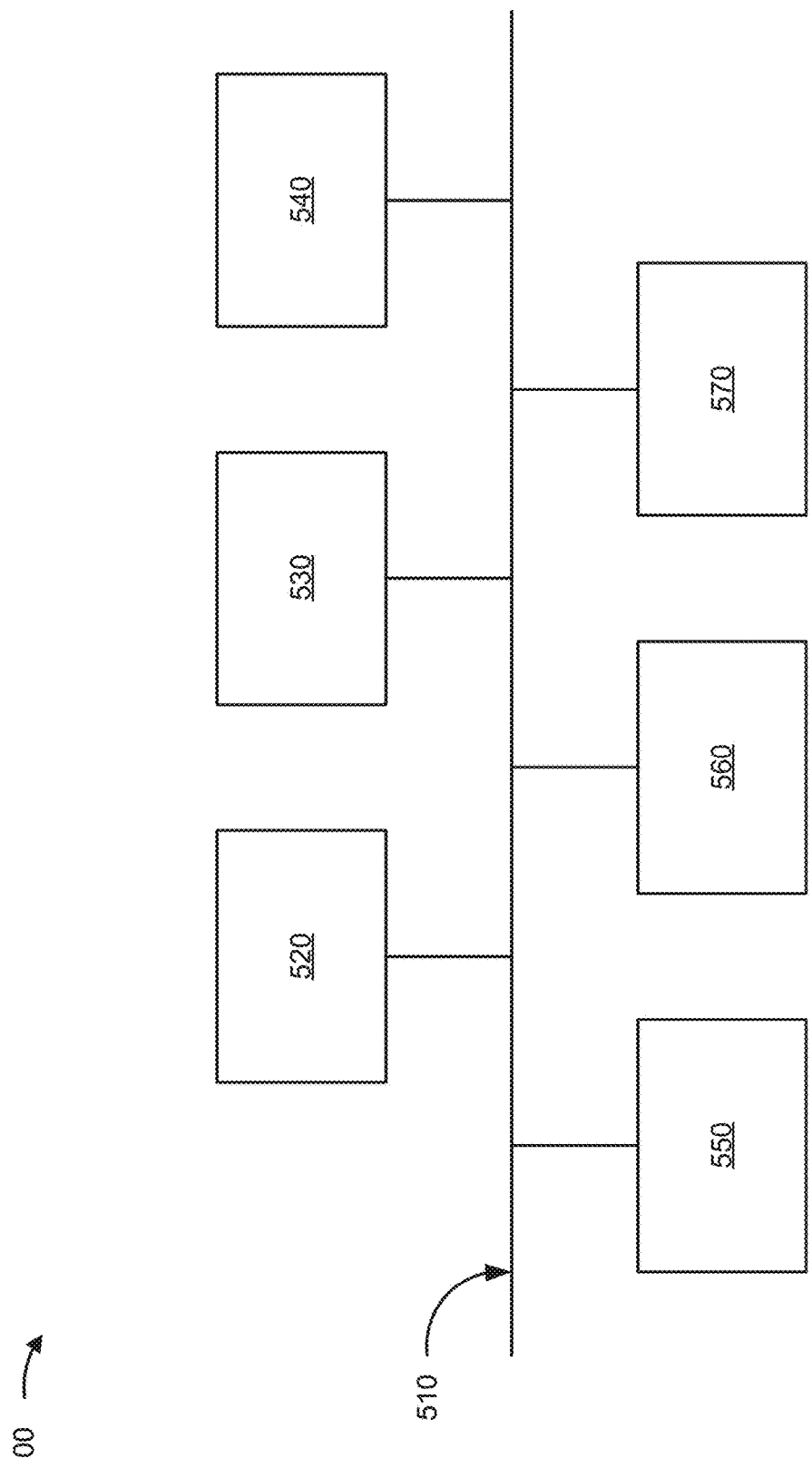
FIG. 5 is a diagram of example components of one or more devices of FIG. 4.

FIG. 5 is a diagram of example components of a device 500. In some implementations, coating device 402, exposure device 404, developer device 406, plating device 408, deposition device 410, etching device 412, polishing device 414, removal device 416, and/or wafer/die transport device 418 includes one or more devices 500 and/or one or more components of device 500. As shown in FIG. 5, device 500 may include a bus 510, a processor 520, a memory 530, a storage component 540, an input component 550, an output component 560, and a communication interface 570.

Bus 510 includes a component that permits communication among multiple components of device 500. Processor 520 is implemented in hardware, firmware, and/or a combination of hardware and software. Processor 520 is a central processing unit (CPU), a graphics processing unit (GPU), an accelerated processing unit (APU), a microprocessor, a microcontroller, a digital signal processor (DSP), a field-programmable gate array (FPGA), an application-specific integrated circuit (ASIC), or another type of processing component. In some implementations, processor 520 includes one or more processors capable of being programmed to perform a function. Memory 530 includes a random access memory (RAM), a read only memory (ROM), and/or another type of dynamic or static storage device (e.g., a flash memory, a magnetic memory, and/or an optical memory) that stores information and/or instructions for use by processor 520.

Storage component 540 stores information and/or software related to the operation and use of device 500. For example, storage component 540 may include a hard disk (e.g., a magnetic disk, an optical disk, and/or a magneto-optic disk), a solid state drive (SSD), a compact disc (CD), a digital versatile disc (DVD), a floppy disk, a cartridge, a magnetic tape, and/or another type of non-transitory computer-readable medium, along with a corresponding drive.

Input component 550 includes a component that permits device 500 to receive information, such as via user input (e.g., a touch screen display, a keyboard, a keypad, a mouse, a button, a switch, and/or a microphone). Additionally, or alternatively, input component 550 may include a component for determining location (e.g., a global positioning system (GPS) component) and/or a sensor (e.g., an accelerometer, a gyroscope, an actuator, another type of positional or environmental sensor, and/or the like). Output component 560 includes a component that provides output information from device 500 (via, e.g., a display, a speaker, a haptic feedback component, an audio or visual indicator, and/or the like).

Communication interface 570 includes a transceiver-like component (e.g., a transceiver, a separate receiver, a separate transmitter, and/or the like) that enables device 500 to communicate with other devices, such as via a wired connection, a wireless connection, or a combination of wired and wireless connections. Communication interface 570 may permit device 500 to receive information from another device and/or provide information to another device. For example, communication interface 570 may include an Ethernet interface, an optical interface, a coaxial interface, an infrared interface, a radio frequency (RF) interface, a universal serial bus (USB) interface, a Wi-Fi interface, a cellular network interface, and/or the like.

Device 500 may perform one or more processes described herein. Device 500 may perform these processes based on processor 520 executing software instructions stored by a non-transitory computer-readable medium, such as memory 530 and/or storage component 540. As used herein, the term "computer-readable medium" refers to a non-transitory memory device. A memory device includes memory space within a single physical storage device or memory space spread across multiple physical storage devices.

Software instructions may be read into memory 530 and/or storage component 540 from another computer-readable medium or from another device via communication interface 570. When executed, software instructions stored in memory 530 and/or storage component 540 may cause processor 520 to perform one or more processes described herein. Additionally, or alternatively, hardware circuitry may be used in place of or in combination with software instructions to perform one or more processes described herein. Thus, implementations described herein are not limited to any specific combination of hardware circuitry and software.

The number and arrangement of components shown in FIG. 5 are provided as an example. In practice, device 500 may include additional components, fewer components, different components, or differently arranged components than those shown in FIG. 5. Additionally, or alternatively, a set of components (e.g., one or more components) of device 500 may perform one or more functions described as being performed by another set of components of device 500.

Figure 6:
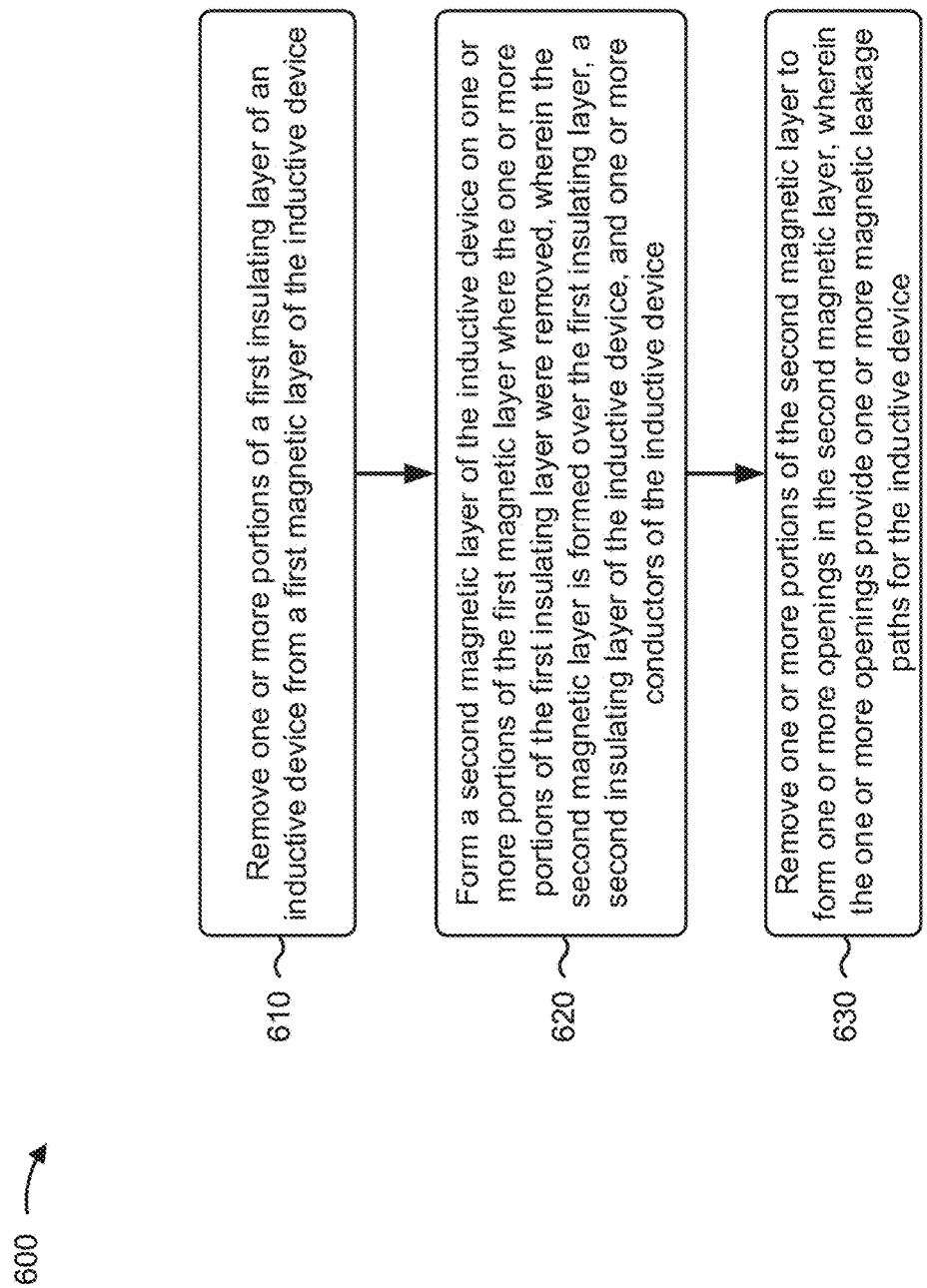
FIG. 6 is a flowchart of example process for forming an inductive device.

FIG. 6 is a flow chart of an example process 600 associated with forming an inductive device. In some implementations, one or more process blocks of FIG. 6 are performed by one or more semiconductor processing devices (e.g., coating device 402, exposure device 404, developer device 406, plating device 408, deposition device 410, etching device 412, polishing device 414, removal device 416, and/or the like). Additionally, or alternatively, one or more process blocks of FIG. 6 may be performed by one or more components of a device 500, such as processor 520, memory 530, storage component 540, input component 550, output component 560, communication interface 570, and/or the like.

As shown in FIG. 6, process 600 may include removing one or more portions of a first insulating layer of an inductive device from a first magnetic layer of the inductive device (block 610). For example, the one or more semiconductor processing devices may remove one or more portions of a first insulating layer (e.g., insulating layer 102) of an inductive device (e.g., inductive device 100) from a first magnetic layer (e.g., lower magnetic layer 108*a*) of the inductive device, as described above.

As further shown in FIG. 6, process 600 may include forming a second magnetic layer (108*b*) of the inductive device on one or more portions of the first magnetic layer, where the one or more portions of the first insulating layer were removed, where the second magnetic layer is formed over the first insulating layer, a second insulating layer of the inductive device, and one or more conductors of the inductive device (block 620). For example, the one or more semiconductor processing devices may form a second magnetic layer (e.g., upper magnetic layer 108*b*) of the inductive device on one or more portions of the first magnetic layer, as described above. In some implementations, the one or more portions of the first insulating layer were removed. In some implementations, the second magnetic layer is formed over the first insulating layer, a second insulating layer (e.g., insulating layer 106) of the inductive device, and one or more conductors (e.g., conductor(s) 104) of the inductive device.

As further shown in FIG. 6, process 600 may include removing one or more portions of the second magnetic layer to form one or more openings in the second magnetic layer, wherein the one or more openings provide one or more magnetic leakage paths for the inductive device (block 630). For example, the one or more semiconductor processing devices may remove one or more portions of the second magnetic layer to form one or more openings (e.g., opening(s) 110) in the second magnetic layer, as described above. In some implementations, the one or more openings provide one or more magnetic leakage paths for the inductive device.

Process 600 may include additional implementations, such as any single implementation or any combination of implementations described below and/or in connection with one or more other processes described elsewhere herein.

In a first implementation, removing the one or more portions of the second magnetic layer includes forming a photoresist layer (photoresist layer 216) on the second magnetic layer, patterning the photoresist layer, and etching, after patterning the photoresist layer, the one or more portions of the second magnetic layer using the photoresist. In a second implementation, alone or in combination with the first implementation, process 600 includes forming the one or more conductors on the insulating layer, forming the second insulating layer on the first insulating layer and the one or more conductors, and forming the second magnetic layer to cover the second insulating layer and the one or more portions of the first magnetic layer.

In a third implementation, alone or in combination with one or more of the first and second implementations, removing the one or more portions of the second magnetic layer includes determining, based on one or more performance parameters for the inductive device, at least one of a respective shape for each of the one or more openings, a respective size for each of the one or more openings, or a respective location in the second magnetic layer for each of the one or more openings, and removing the one or more portions of the second magnetic layer to form the one or more openings based on the at least one of the respective shape for each of the one or more openings, the respective size for each of the one or more openings, or the respective location in the second magnetic layer for each of the one or more openings.

In a fourth implementation, alone or in combination with one or more of the first through third implementations, the one or more performance parameters include a maximum inductance for the inductive device. In a fifth implementation, alone or in combination with one or more of the first through fourth implementations, the one or more performance parameters include a saturation current for the inductive device. In a sixth implementation, alone or in combination with one or more of the first through fifth implementations, a shape for an opening of the one or more openings includes a trench, and a size for the opening includes a length parameter for the trench and a width parameter for the trench.

Although FIG. 6 shows example blocks of process 600, in some implementations, process 600 may include additional blocks, fewer blocks, different blocks, or differently arranged blocks than those depicted in FIG. 6. Additionally, or alternatively, two or more of the blocks of process 600 may be performed in parallel.

In this way, an inductive device (e.g., inductive device 100) includes an insulating layer (e.g., insulating layer 102), a lower magnetic layer (e.g., lower magnetic layer 108*a*), and an upper magnetic layer (e.g., upper magnetic layer 108*b*) that are formed such that the insulating layer does not separate the lower magnetic layer and the upper magnetic layer at the outer edges of the inductive device. The lower magnetic layer and the upper magnetic layer form a continuous magnetic layer around the insulating layer and the conductors of the inductive device. Magnetic leakage paths are provided for the inductive device by forming openings (e.g., opening(s) 110) in the upper magnetic layer instead of through the formation of the insulating layer. The openings are formed in the upper magnetic layer by semiconductor processes that have relatively higher precision and accuracy compared to semiconductor processes for forming the insulation layer such as spin coating. This reduces magnetic leakage path variation within the inductive device and from inductive device to inductive device. Moreover, the performance characteristics of the inductive device can be tuned based on the attributes of the openings in the upper magnetic layer to achieve desired and/or optimal inductor performance.

As described in greater detail above, some implementations described herein provide an inductive device. The inductive device includes one or more insulating layers, one or more conductors, a lower magnetic layer, and an upper magnetic layer. The lower magnetic layer contacts the upper magnetic layer in one or more edges or one or more wings of the inductive device such that a continuous magnetic layer is formed in the one or more edges or the one or more wings. The lower magnetic layer and the upper magnetic layer surround the one or more insulating layers and the one or more conductors, except for one or more openings through at least one of the upper magnetic layer or through the lower magnetic layer that provide one or more magnetic leakage paths for the inductive device.

As described in greater detail above, some implementations described herein provide a method. The method includes removing one or more portions of a first insulating layer of an inductive device from a first magnetic layer of the inductive device. The method includes forming a second magnetic layer of the inductive device on one or more portions of the first magnetic layer where the one or more portions of the first insulating layer were removed. The second magnetic layer is formed over the first insulating layer, a second insulating layer of the inductive device, and one or more conductors of the inductive device. The method includes removing one or more portions of the second magnetic layer to form one or more openings in the second magnetic layer. The one or more openings provide one or more magnetic leakage paths for the inductive device.

As described in greater detail above, some implementations described herein provide an inductive device. The inductive device includes a lower magnetic layer, a first insulating layer on a portion of the lower magnetic layer, one or more conductors on the first insulating layer, a second insulating layer over the first insulating layer and the one or more conductors, and an upper magnetic layer on the second insulating layer and contacting portions of the lower magnetic layer in one or more edges or one or more wings of the inductive device. One or more openings are formed through the upper magnetic layer and to the second insulating layer to provide one or more magnetic leakage paths for the inductive device. The one or more openings are based on one or more performance parameters for the inductive device.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An inductive device, comprising:
    a lower magnetic layer;
    an upper magnetic layer in contact with the lower magnetic layer, wherein the upper magnetic layer comprises one or more openings to provide one or more magnetic leakage paths for the inductive device; and
    one or more insulating layers insulating one or more conductors from the lower magnetic layer and the upper magnetic layer.

2. The inductive device of claim 1, wherein a first opening of the one or more openings is above a first conductor of the one or more conductors; and
    wherein a second opening of the one or more openings is above a second conductor of the one or more conductors.

3. The inductive device of claim 1, wherein the one or more openings are formed through the upper magnetic layer at a top of the inductive device.

4. The inductive device of claim 1, wherein the one or more openings are formed through the lower magnetic layer at a bottom of the inductive device.

5. The inductive device of claim 1, wherein the one or more openings include one or more holes through at least one of the upper magnetic layer or the lower magnetic layer.

6. The inductive device of claim 1, wherein the one or more openings include one or more trenches through at least one of the upper magnetic layer or the lower magnetic layer.

7. An inductive device, comprising:
    one or more conductors;
    one or more insulating layers surrounding the one or more conductors;
    one or more magnetic layers surrounding the one or more insulating layers; and
    one or more openings through the one or more magnetic layers.

8. The inductive device of claim 7, wherein the one or more magnetic layers comprises a first magnetic layer and a second magnetic layer, and wherein each of the one or more openings are in the first magnetic layer.

9. The inductive device of claim 8, wherein the first magnetic layer comprises side walls and a top portion connected to the side walls, and the second magnetic layer is flat.

10. The inductive device of claim 9, wherein the one or more openings are in the top portion of the first magnetic layer.

11. The inductive device of claim 8, wherein the one or more insulating layers comprises a first insulating layer, in contact with the first magnetic layer and not with the second magnetic layer, and a second insulating layer, in contact with the second magnetic layer and not with the first magnetic layer.

12. The inductive device of claim 11, wherein the first insulating layer comprises one or more different materials than the second insulating layer.

13. The inductive device of claim 7, wherein the one or more openings comprises one or more trenches or one or more holes.

* * * * *